(12) United States Patent
Hyun et al.

(10) Patent No.: US 7,577,042 B2
(45) Date of Patent: Aug. 18, 2009

(54) METHOD OF PROGRAMMING MULTI-LEVEL SEMICONDUCTOR MEMORY DEVICE AND MULTI-LEVEL SEMICONDUCTOR MEMORY DEVICE

(75) Inventors: Jae-woong Hyun, Uljeongbu-si (KR); Kyoung-lae Cho, Yongin-si (KR); Kyu-charn Park, Pyeongtaek-si (KR); Yoon-dong Park, Yongin-si (KR); Choong-ho Lee, Seongnam-si (KR); Sung-jae Byun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 11/978,578

(22) Filed: Oct. 30, 2007

(65) Prior Publication Data

US 2008/0159013 A1 Jul. 3, 2008

(30) Foreign Application Priority Data

Dec. 28, 2006 (KR) .................... 10-2006-0136821

(51) Int. Cl.
*G11C 7/00* (2006.01)

(52) U.S. Cl. .................... 365/189.05; 365/185.03; 365/185.18

(58) Field of Classification Search ............ 365/189.05, 365/185.03, 185.18
See application file for complete search history.

(56) References Cited

U.S. PATENT DOCUMENTS 7,254,064 B2 * 8/2007 Kim et al. .............. 365/189.05

* cited by examiner

*Primary Examiner*—Huan Hoang
(74) *Attorney, Agent, or Firm*—Harness, Dickey & Pierce, P.L.C.

(57) ABSTRACT

Provided in one example embodiment, a method of programming n bits of data to a semiconductor memory device may include outputting a first bit of data written in a memory cell from a first latch, storing the first bit of the data to a third latch, storing a second bit of the data to the first latch, outputting the second bit of the data from the first latch, storing the second bit of the data to the second latch, and writing the second bit of the data stored in the second latch to the memory cell with reference to a data storage state of the first bit of the data stored in the third latch.

20 Claims, 3 Drawing Sheets

METHOD OF PROGRAMMING MULTI-LEVEL SEMICONDUCTOR MEMORY DEVICE AND MULTI-LEVEL SEMICONDUCTOR MEMORY DEVICE

PRIORITY CLAIM

A claim of priority is made to Korean Patent Application No. 10-2006-0136821, filed on Dec. 28, 2006, in the Korean Intellectual Property Office, the disclosure of which is incorporated herein in its entirety by reference.

BACKGROUND

1. Field

Example embodiments of the present invention may relate to a programming method and a semiconductor memory device, and more particularly, to a method of programming a multi-level semiconductor memory device and a multi-level semiconductor memory device.

2. Description of the Related Art

A non-volatile memory device may electrically erase and program data, and may retain stored data even if power is not applied thereto. A representative non-volatile memory device is a flash memory device.

Each memory cell of a flash memory device includes a cell transistor having a control gate, a floating gate, and source and drain regions. The cell transistor programs and erases by a Fowler-Nordheim (F-N) tunneling.

An erase operation is performed by applying a ground voltage to the control gate of the cell transistor and a voltage higher than a supply voltage to a semiconductor substrate (or a bulk). Under the erase bias condition, a strong electric field is formed between the floating gate and the bulk due to a substantial voltage difference therebetween, and as a result, electrons in the floating gate are discharged to the bulk due to the F-N tunneling. A threshold voltage of the erased cell transistor has a negative value.

A program operation of the cell transistor is performed by applying a voltage higher than the supply voltage to the control gate and applying a ground voltage to the drain and bulk. Under the program bias condition, electrons are injected to the floating gate of the cell transistor by the F-N tunneling. A threshold voltage of the programmed cell transistor has a positive value.

Recently, in order to further improve the integration of a flash memory device, a multi-level flash memory device capable of storing a plurality of data in a single memory cell has been researched. In the multi-level flash memory device, multi-bits (at least two bits) may be stored in each memory cell. A memory cell storing multi-bits is called a multi-level cell. A memory cell storing a single bit is called a single-level cell. Since the multi-level cell stores multi-bits, the multi-level cell has two or more threshold voltage distributions and has two or more data storage states corresponding to the two or more threshold voltage distributions, respectively. Hereinafter, an example in which 2 bits of data are stored in a memory cell of a multi-level flash memory device will be described. However, it is also possible to store three or more bits of data in the memory cell of the multi-level flash memory.

A multi-level cell storing 2 bits may have four data storage states, that is, "11", "01", "10", and "00". For example, "11" may represent an erased state, and "01", "10", and "00" may represent programmed states.

The four data storage states respectively correspond to threshold voltage distributions of the multi-level cell. For example, if the threshold voltage distributions of the multi-level cell are respectively "VTH1-VTH2", "VTH3-VTH4", "VTH5-VTH6", and "VTH7-VTH8", the data storage states "11", "0", "10", and "00" correspond to "VTH1-VTH2", "VTH3-VTH4", "VTH5-VTH6", and "VTH7-VTH8", respectively. That is, if a threshold voltage of the multi-level cell corresponds to one of the four threshold voltage distributions, 2 bits of data corresponding to the threshold voltage among "11", "01", "10", and "00" are stored in the multi-level cell.

Meanwhile, when two or more bits of data are stored in the multi-level cell, generally, the two or more bits of data are sequentially stored for each bit in the multi-level cell. In this case, when a bit (for example, a second bit) following a first bit of the data is stored in the multi-level cell, a data storage state of the second bit that is to be written is determined with reference to a data storage state of the first bit. In order to determine the data storage state of the first bit, which has been previously written, the data storage state of the first bit has to be read from the multi-level cell. However, if the data storage state of the second bit is read from the memory cell during a data write operation, a data write speed slows down.

SUMMARY

Example embodiments may provide a memory cell programming method using three latches, and a semiconductor memory device capable of programming a memory cell.

In an example embodiment, a method of programming n bits of data to a semiconductor memory device may include storing a (k−1)-th bit (k being a natural number greater than 2) of data to a first latch, storing the (k−1)-th bit of the data stored in the first latched to a third latch, storing a k-th bit of the data in the first latch, storing the k-th bit of the data stored in the first latch to the second latch, and writing the k-th bit of the data stored in the second latch to a memory cell with reference to a data storage state of the (k−1)-th bit of the data stored in the third latch.

In another example embodiment, a method of programming n bits of data to a semiconductor memory device may include outputting a first bit of data written in a memory cell from a first latch, storing the first bit of the data to a third latch, storing a second bit of the data to the first latch, outputting the second bit of the data from the first latch, storing the second bit of the data to the second latch, and writing the second bit of the data stored in the second latch to the memory cell with reference to a data storage state of the first bit of the data stored in the third latch.

In an example embodiment, a semiconductor memory device may include at least one memory cell configured to store n bits (n being a natural number greater than 3) of data, a first latch configured to receive and latch the n bits of the data, and output the n bits of the data, a second latch configured to receive and latch a k-th bit (k being a natural number greater than 2) of the data from the first latch, and output the k-th bit of the data, and a third latch configured to receive and latch a (k−1)-th bit of the data from the first latch, and output the (k−1)-th bit of the data. The k-th bit of the data latched by the second latch is written to the at least one memory cell with reference to a data storage state of the (k−1)-th bit of the data latched by the third latch.

In another example embodiment, a semiconductor memory device may include at least one memory cell configured to store n bits (n being a natural number greater than 3) of data, a first latch configured to receive and latch the n bits of the data, and output the n bits of the data, a second latch configured to receive and latch a first bit of the data, from the first latch, and output the first bit of the data, and a third latch configured to receive and latch a second bit of the data, and output the second bit of the data. The first bit of the data latched by the second latch is written to the at least one memory cell with reference to a data storage state of the second bit of the data latched by the third latch.

BRIEF DESCRIPTION OF THE DRAWINGS

The above and other features of example embodiments of the present invention may become more apparent with the detail description of example embodiments with reference to the attached drawings in which.

DETAILED DESCRIPTION OF EXAMPLE EMBODIMENTS

The attached drawings are referred to in order to gain an understanding of example embodiments.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
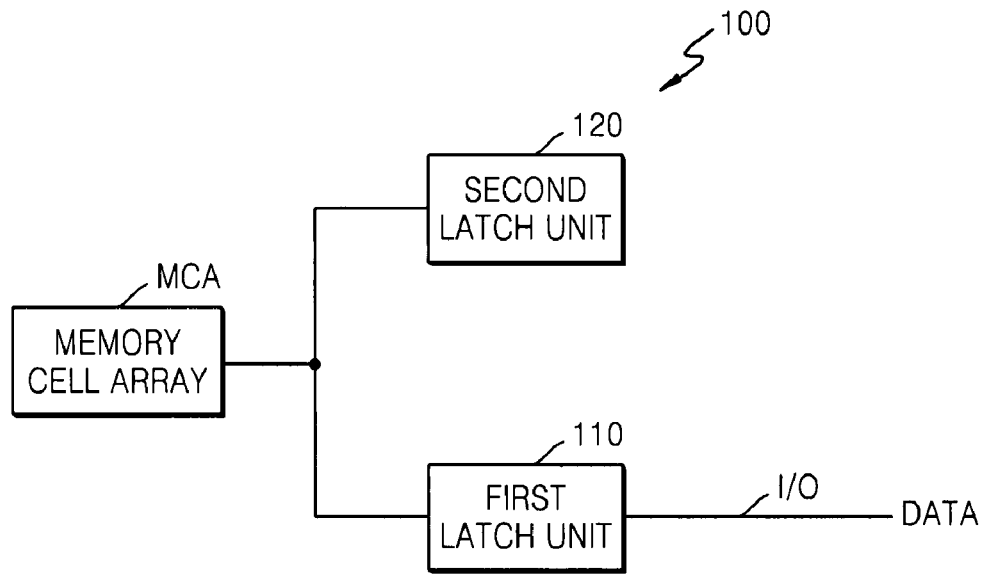
FIG. 1 is a block diagram of a conventional semiconductor memory device capable of programming a memory cell using two latches.

FIG. 1 is a block diagram of a conventional semiconductor memory device 100 capable of programming a memory cell using two latches.

Referring to FIG. 1, the semiconductor memory device 100 includes a memory cell array MCA, a first latch 110, and a second latch 120. Data DATA consisting of a plurality of bits is stored in each memory cell included in the memory cell array MCA.

The first latch 110 receives a first bit of the data DATA that is to be written in the memory cell array MCA through an input/output line I/O, and latches the first bit of the data DATA. The first bit latched by the first latch 110 is output to and latched by the second latch 120. The first bit latched by the second latch 120 is written in a memory cell of the memory cell array MCA.

Then, the first latch 110 receives and latches a second bit of the data DATA, and then outputs the second bit to the second latch 120. The first latch 110 receives a current state of the memory cell and stores the current state in the first latch 110. The current state of the memory cell is read from the memory cell, which corresponds to the first bit previously written in the memory cell. The operation of reading the current state of the memory cell is hereinafter referred to as "internal-reading".

The semiconductor memory device 100 programs the second bit of the data DATA stored in the second latch 120 to the memory cell with reference to the current state of the memory cell stored in the first latch 110.

Figure 2:
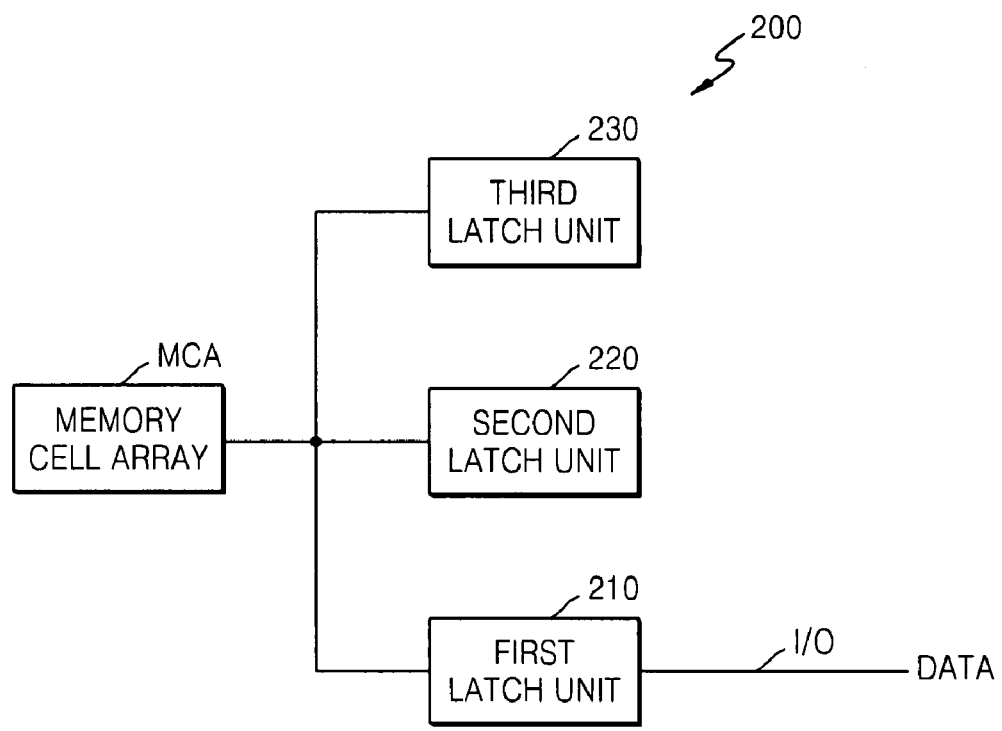
FIG. 2 is a block diagram of a semiconductor memory device capable of programming a memory cell using three latches according to an example embodiment of the present invention.

FIG. 2 is a block diagram of a semiconductor memory device 200 capable of programming a memory cell using three latches according to an example embodiment of the present invention.

Referring to FIG. 2, the semiconductor memory device 200 may include a memory cell array MCA including at least one memory cell, a first latch unit 210, a second latch unit 220, and a third latch unit 230.

Each memory cell may store n bits of data, wherein n may be a natural number greater than 3. The first latch unit 210 may receive and latch data DATA and then output the data DATA. From the first latch unit 210, the second latch unit 220 may receive and latch a k-th bit (k may be a natural number greater than 2) that may be written to the memory cell, and then outputs the k-th bit. From the first latch unit 210, the third latch unit 230 may receive and latch a (k−1)-th bit that may have been previously written in the memory cell, and then outputs the (k−1)-th bit. The semiconductor memory device 200 may write the k-th bit, which may be latched by the second latch unit 220, in the memory cell, with reference to a data storage state of the (k−1)-th bit, which may be latched by the third latch unit 230.

In the conventional method, to write a bit (e.g., a k-th bit), a data storage state of the bit (e.g., a (k−1)-th bit), which has been previously written in a memory cell, has to be read from the memory cell. However, in the semiconductor memory device 200 according to the example embodiment, because the previous bit (e.g., a (k−1)-th bit) of the bit (e.g., a k-th bit) that is to be written is stored in the third latch unit 230, the bit that is to be written is written in the memory cell with reference to data storage state of the previous bit stored in the third latch unit 230. Accordingly, the semiconductor memory device 200 need not read from the memory cell any bit that may have been previously written in the memory cell during a data write operation, thereby a data write speed may be increased.

In the semiconductor memory device 200, the first latch unit 210 may output the k-th bit to the third latch unit 230 after the k-th bit is written in the memory cell. Then, the first latch unit 210 may receive a (k+1)-th bit and output the (k+1)-th bit to the second latch unit 220. In detail, after the k-th bit stored in the second latch unit 220 is written in the memory cell with reference to data storage state of the (k−1)-th bit stored in the third latch unit 230, the first latch unit 210 may output the k-th bit to the third latch unit 230. Then, the first latch unit 210 may receive and latch the (k+1)-th bit, and then output the (k+1)-th bit to the second latch unit 220. At this time, the (k+1)-th bit, which may be stored in the second latch unit 220, may be written in the memory cell, with reference to data storage state of the k-th bit, which may be stored in the third latch unit 230.

In example embodiments, the memory cell may be a non-volatile memory cell in which n bits of data are stored. Also, the memory cell may have $2^n$ data storage states that are classified according to threshold voltages. For example, if 4 bits of data are stored in a single memory cell, the memory cell may have $2^4$ data storage states.

Figure 3:
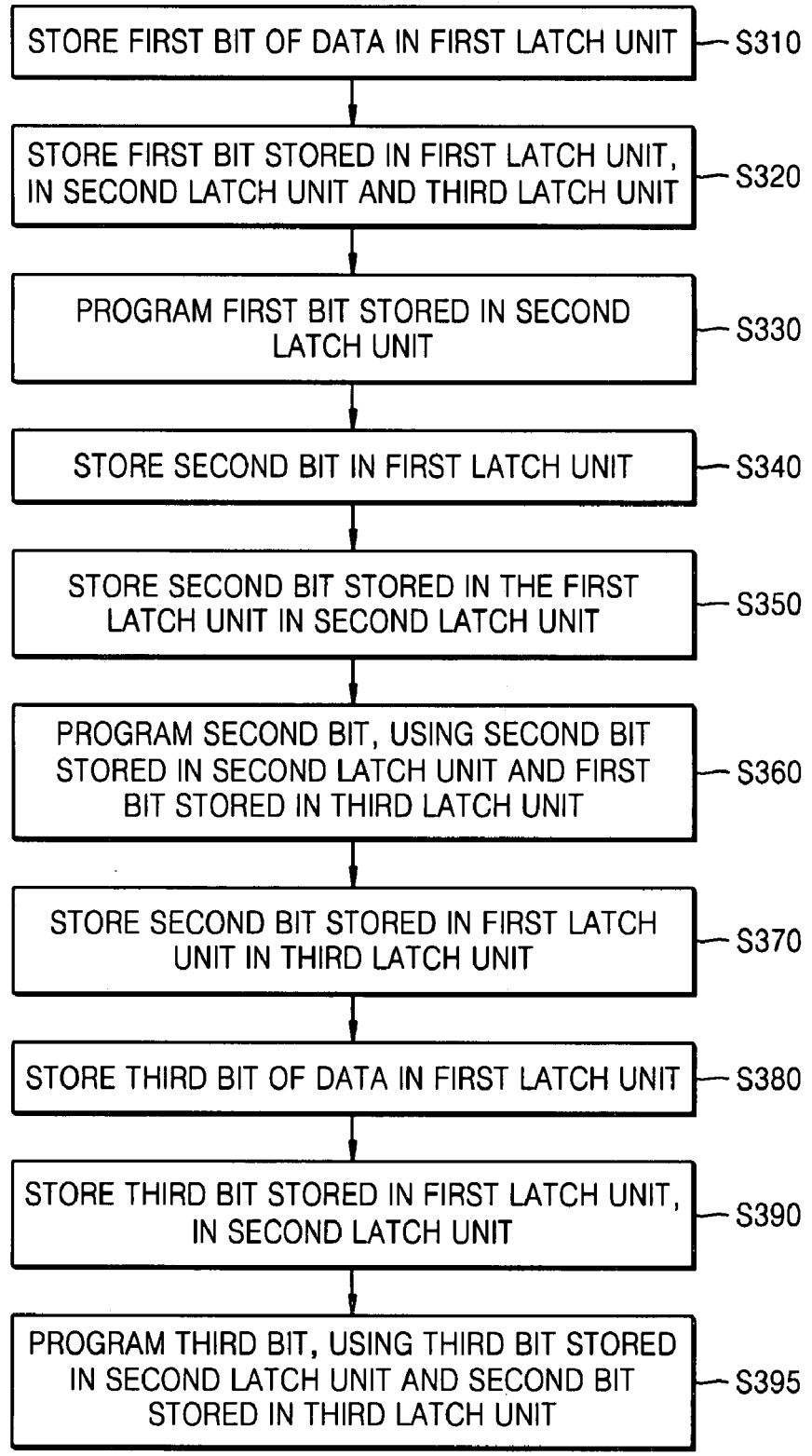
FIG. 3 is a flowchart of a memory cell programming method using three latches according to an example embodiment of the present invention.

FIG. 3 is a flowchart of a memory cell programming method according to an example embodiment. Hereinafter, the memory cell programming method will be described with reference to FIGS. 2 and 3. In the memory cell programming method, n bits of data (n may be a natural number greater than 3) may be written in a memory cell of a semiconductor memory device having first, second, and third latch units 210, 220, and 230.

The memory cell programming method may include storing a first bit of the data in the first latch unit 210 (step S310). The first bit stored in the first latch unit 210 may be stored in the second latch unit 220 and the third latch unit 230 (step S320). The first bit stored in the second latch unit 220 may be written in the memory cell (step S330). Then, a second bit of the data may be stored in the first latch unit 210 (step S340). Thereafter, the second bit stored in the first latch unit 210 may be stored in the second latch unit 220 (step S350), and the second bit stored in the second latch unit 220 may be written in the memory cell with reference to data storage state of the first bit stored in the third latch unit 230 (step S360).

A (k−1)-th bit (for example, the second bit) of data, which may be stored in the first latch unit 210, may be stored in the third latch unit 230 (step S370). Then, a k-th bit (for example, a third bit) of the data may be stored in the first latch unit 210 (step S380). Next, the k-th bit (for example, the third bit) of the data stored in the first latch unit 210 may be stored in the second latch unit 220 (step S390). The k-th bit (for example, the third bit) of the data stored in the second latch unit 220 may be written in a memory cell, with reference to data storage state of the (k−1)-th bit (for example, the second bit) of the data, which may be stored in the third latch unit 230.

The memory cell programming method may further include comparing the k value with an n value, after writing the k-th bit of the data stored in the second latch unit 220 in the memory cell, wherein the n value represents the bit number of data, which may be stored in the memory cell. If the k value is less than the n value, a value obtained by adding "1" to the k value may be stored in the third latch unit 230. For example, if 4 bits of data have to be stored in the memory cell, it may be possible set the k value to "3," and the third bit of the data may be written in the memory cell. Thereafter, the k value may be set to "4," and the fourth bit of the data may be written in the memory cell. After the fourth bit of the data is written in the memory cell, the data write operation may be complete.

Figure 4:
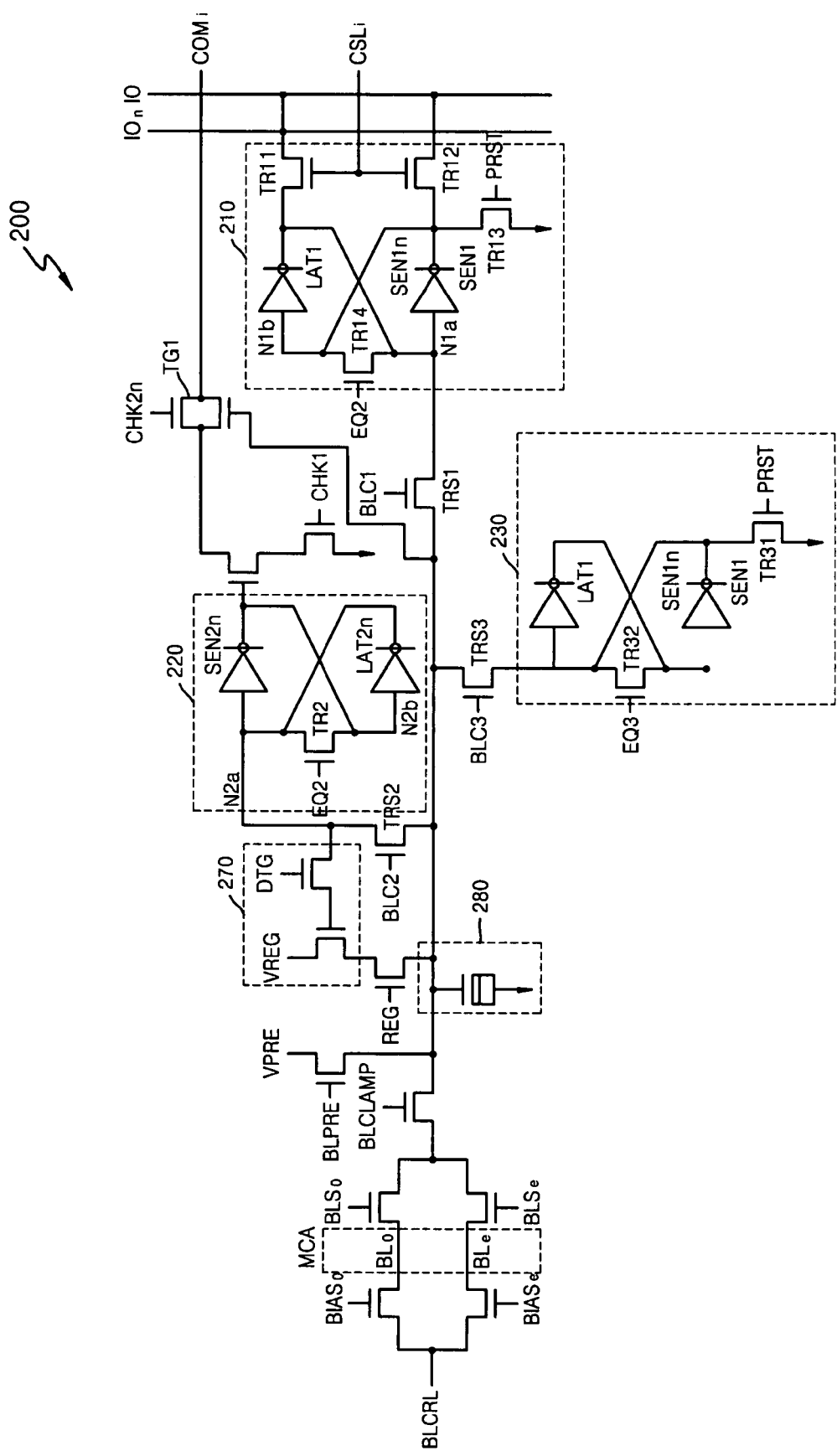
FIG. 4 is a circuit diagram of the semiconductor memory device illustrated in FIG. 2.

FIG. 4 is a detail circuit diagram of the semiconductor memory device 200 illustrated in FIG. 2.

Referring to FIG. 4, the first latch unit 210 may be connected to a pair of data input/output lines IO and $IO_n$ through transistors TR11 and TR12. The transistors TR11 and TR12 may be turned on or off according to a column selection line signal $CSL_i$. If the transistors TR11 and TR12 are turned on, the first latch unit 210 may receive and latch data. The data latched by the first latch unit 210 may be transferred to a first node if a first switch transistor TRS1 is turned on. If a second switch transistor TRS2 is turned on, the data transferred to the first node may be transferred to the second latch unit 220. If a third transistor TRS3 is turned on, the data transferred to an output node may be transferred to the third latch unit 230. Here, the first through third switch transistors TRS1, TRS2, and TRS3 may be turned on or off according to first through third switch control signals BLC1, BLC2, and BLC3, respectively.

Hereinafter, operation in which a third bit of data is programmed with reference to a second bit of the data will be described with reference to FIG. 4. If the first and third switch control signals BLC1 and BLC3 are activated, a second bit of data stored in the first latch unit 210 may be transferred to and latched by the third latch unit 230. The second switch control signal BLC2 may be maintained in a non-activated state. Then, if a column selection line signal $CSL_i$ is activated, a third bit of the data may be transferred to and latched by the first latch unit 210 through the input/output lines IO and $IO_n$. Then, if the first and third switch control signal BLC1 and BLC3 are activated, the third bit of the data latched by the first latch unit 210 may be transferred to and latched by the second latch unit 220. At this time, the first switch control signal BLC1 may be maintained in a non-activated state. Accordingly, the second bit of the data latched by the third latch unit 230 may be maintained in the third latch unit 230. Then, the third bit stored in the second latch unit 220 may be written in a memory cell included in the memory cell array MCA, with reference to the second bit stored in the third latch unit 230. Here, the operation of writing data in the memory cell may be performed through bit lines $BL_o$ and $BL_e$ that are connected to the memory cell array MCA.

As described above, a memory cell programming method and a semiconductor memory device according to example embodiments may perform memory cell programming using three latches. Accordingly, because memory cell programming may be performed without internal-reading previous bits from a memory cell, a time required for the memory cell programming may be reduced.

While example embodiments have been particularly shown and described with reference, it will be understood by those of ordinary skill in the art that various changes in form and details may be made therein without departing from scope of example embodiments.

What is claimed is:

1. A method of programming n bits of data to a semiconductor memory device, comprising:
   storing a (k−1)-th bit (k being a natural number greater than 2) of data to a first latch;
   storing the (k−1)-th bit of the data stored in the first latched to a third latch;
   storing a k-th bit of the data in the first latch;
   storing the k-th bit of the data stored in the first latch to the second latch; and
   writing the k-th bit of the data stored in the second latch to a memory cell with reference to a data storage state of the (k−1)-th bit of the data stored in the third latch.

2. The method of claim 1, further comprising:
   comparing the k value with an n value (n being a natural number greater than 3), wherein, if the k value is less than the n value, storing a value obtained by adding "1" to the k value to the third latch.

3. The method of claim 1, further comprising:
   storing a first bit of the data in the first latch.

4. The method of claim 3, further comprising:
storing the first bit of the data stored in the first latch to the second latch and the third latch; and
writing the first bit of the data stored in the second latch to the memory cell.

5. The method of claim 4, further comprising:
storing a second bit of the data to the first latch.

6. The method of claim 3, further comprising:
storing the first bit of the data to the second latch; and
writing the first bit of the data stored in the second latch to the memory cell.

7. The method of claim 6, further comprising:
storing the first bit of the data stored in the first latch to the third latch.

8. A method of programming n bits of data to a semiconductor memory device, comprising:
outputting a first bit of data written to a memory cell from a first latch;
storing the first bit of the data to a third latch;
storing a second bit of the data to the first latch;
outputting the second bit of the data from the first latch;
storing the second bit of the data to the second latch; and
writing the second bit of the data stored in the second latch to the memory cell with reference to a data storage state of the first bit of the data stored in the third latch.

9. The method of claim 8, wherein the first and second bits are written to the at least one memory cell.

10. A semiconductor memory device comprising:
at least one memory cell configured to store n bits (n being a natural number greater than 3) of data;
a first latch configured to receive and latch the n bits of the data, and output the n bits of the data;
a second latch configured to receive and latch a k-th bit (k being a natural number greater than 2) of the data from the first latch, and output the k-th bit of the data; and
a third latch configured to receive and latch a (k−1)-th bit of the data from the first latch, and output the (k−1)-th bit of the data,
wherein the k-th bit of the data latched by the second latch is written to the at least one memory cell with reference to a data storage state of the (k−1)-th bit of the data latched by the third latch.

11. The memory device of claim 10, wherein:
the first latch is configured to output the k-th bit of the data to the third latch, receive a (k+1)-th bit of the data, and output the (k+1)-th bit of the data to the second latch.

12. The semiconductor memory device of claim 10, wherein the at least one memory cell is a non-volatile memory cell.

13. The semiconductor memory device of claim 12, wherein the non-volatile memory cell is a multi-level flash memory cell.

14. The semiconductor memory device of claim 13, wherein the multi-level flash memory cell has $2^n$ data storage states that are classified according to threshold voltages.

15. The semiconductor memory device of claim 10, wherein the (k−1)-th bit and (k−1)-th bit of the data are written to the at least one memory cell.

16. A semiconductor memory device comprising:
at least one memory cell configured to store n bits (n being a natural number greater than 3) of data;
a first latch configured to receive and latch the n bits of the data, and output the n bits of the data;
a second latch configured to receive and latch a first bit of the data, from the first latch, and output the first bit of the data; and
a third latch configured to receive and latch a second bit of the data, and output the second bit of the data,
wherein the first bit of the data latched by the second latch is written to the at least one memory cell with reference to a data storage state of the second bit of the data latched by the third latch.

17. The semiconductor memory device of claim 16, wherein:
the first latch is further configured to output the first bit of the data to the third latch, receive a next bit of the data following the first bit of the data, and output the next bit of the data to the second latch.

18. The semiconductor memory device of claim 17, wherein the at least one memory cell is a non-volatile memory cell.

19. The semiconductor memory device of claim 18, wherein the non-volatile memory cell is a multi-level flash memory cell.

20. The semiconductor memory cell of claim 16, wherein the first and second bits of the data are written to the at least one memory.

* * * * *